United States Patent
Knisley et al.

(10) Patent No.: US 11,408,068 B2
(45) Date of Patent: Aug. 9, 2022

(54) DEPOSITION OF TELLURIUM-CONTAINING THIN FILMS

(71) Applicants: Applied Materials, Inc., Santa Clara, CA (US); Wayne State University, Detroit, MI (US)

(72) Inventors: Thomas Knisley, Livonia, MI (US); Keenan N. Woods, San Ramon, CA (US); Mark Saly, Santa Clara, CA (US); Charles H. Winter, Bloomfield Hills, MI (US); Apoorva Upadhyay, Ottawa (CA)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/163,687

(22) Filed: Feb. 1, 2021

(65) Prior Publication Data

US 2021/0262084 A1    Aug. 26, 2021

Related U.S. Application Data

(60) Provisional application No. 62/979,082, filed on Feb. 20, 2020.

(51) Int. Cl.
| | |
|---|---|
| C23C 16/18 | (2006.01) |
| C23C 16/455 | (2006.01) |
| C23C 16/30 | (2006.01) |
| C23C 16/44 | (2006.01) |
| H01L 21/02 | (2006.01) |
| H01L 21/285 | (2006.01) |

(52) U.S. Cl.
CPC .......... C23C 16/18 (2013.01); C23C 16/30 (2013.01); C23C 16/4408 (2013.01); C23C 16/45527 (2013.01); H01L 21/0228 (2013.01); H01L 21/28506 (2013.01)

(58) Field of Classification Search
CPC ... C23C 16/18; C23C 16/45525; C23C 16/30; C23C 16/45527; C23C 16/4408; C23C 16/06; C23C 16/32; C23C 16/40
See application file for complete search history.

(56) References Cited

U.S. PATENT DOCUMENTS

| 8,101,237 B2 | 1/2012 | Okubo et al. |
| 2009/0215225 A1 | 8/2009 | Stender et al. |

(Continued)

FOREIGN PATENT DOCUMENTS

| CN | 101838112 A | 9/2010 |

OTHER PUBLICATIONS

PCT International Search Report and Written Opinion in PCT/US2021/016015 dated May 24, 2021, 11 pages.

(Continued)

*Primary Examiner* — Elizabeth A Burkhart
(74) *Attorney, Agent, or Firm* — Servilla Whitney LLC

(57) ABSTRACT

Methods for depositing tellurium-containing films on a substrate are described. The substrate is exposed to a tellurium precursor and a reactant to form the tellurium-containing film (e.g., elemental tellurium, tellurium oxide, tellurium carbide, tellurium silicide, germanium telluride, antimony telluride, germanium antimony telluride). The exposures can be sequential or simultaneous.

15 Claims, 1 Drawing Sheet

(56) References Cited

U.S. PATENT DOCUMENTS

2009/0305458 A1* 12/2009 Hunks .................. C23C 16/305
                                                    438/102
2010/0267195 A1* 10/2010 Marsh ................ H01L 45/1683
                                                    438/102
2012/0028410 A1    2/2012 Marsh

OTHER PUBLICATIONS

Adinolfi, Valerio, et al., "Composition-Controlled Atomic Layer Deposition of Phase-Change Memories and Dvonic Threshold Switches with High Performance", ACS Nano 2019, 13, 10440-10447.

Cheng, Lanxia, et al., "Conformal deposition of GeTe films with tunable Te composition by atomic layer deposition", Journal of Vacuum Science & Technology A 37, 020907 (2019); doi: 0.1116/1.5079661.

Denney, Donald B., et al., "Preparation and NMR Studies of Tetraalkoxyselenuranes and Tetraalkoxytelluranes", J. Am. Chem. Soc. 1981, 103, 2340-2347.

Guo, Pengfei, et al., "A Review of Germanium-Antimony-Telluride Phase Change Materials for Non-Volatile Memories and Optical Modulators", Appl. Sci. 2019, 9, 530; doi:10.3390/app9030530.

Harmgarth, Nicole, et al., "Molecular Precursors for the Phase-Change Material Germanium-Antimony-Telluride, Ge2Sb2Te5 (GST)", Z. Anorg. Allg. Chem. 2017, 643, 1150-1166.

Mehrotra, R.C., et al., "Derivatives of Tellurium with Glycols", Jour. Indian Chem. Soc, vol. 42, No. II, 1965.

* cited by examiner

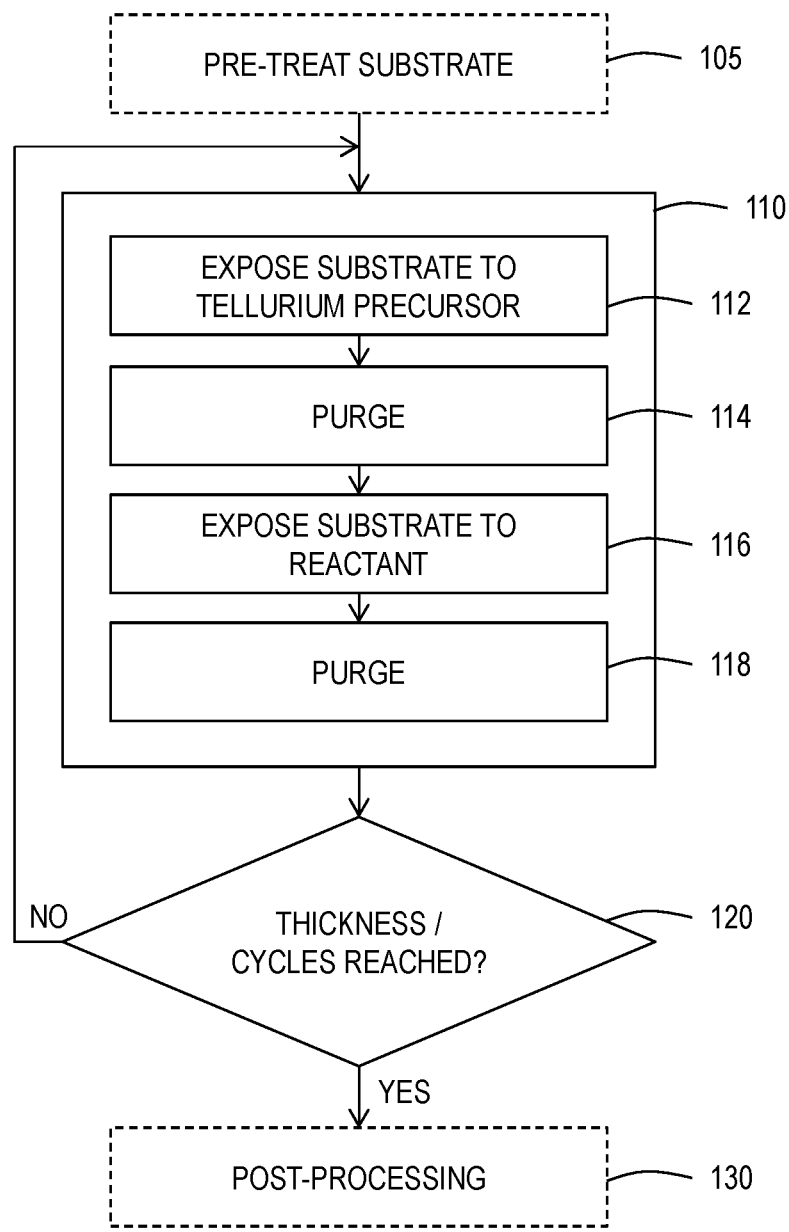

DEPOSITION OF TELLURIUM-CONTAINING THIN FILMS

CROSS-REFERENCE TO RELATED APPLICATIONS

This application claims priority to U.S. Provisional Application No. 62/979,082, filed Feb. 20, 2020, the entire disclosure of which is hereby incorporated by reference herein.

TECHNICAL FIELD

Embodiments of the present disclosure generally relate to methods for depositing tellurium-containing thin films. In particular, embodiments of the disclosure are directed to methods of depositing tellurium-containing thin films by atomic layer deposition.

BACKGROUND

Deposition of thin films on a substrate surface is an important process in a variety of industries including semiconductor processing, diffusion barrier coatings, and dielectrics for magnetic read/write heads. In the semiconductor industry, in particular, miniaturization requires atomic level control of thin film deposition to produce conformal coatings on high aspect structures.

One method for deposition of thin films is atomic layer deposition (ALD). Most ALD processes are based on binary reaction sequences, where each of the two surface reactions occurs sequentially. Because the surface reactions are sequential, the two gas phase reactants are not in contact, and possible gas phase reactions that may form and deposit particles are limited.

As microelectronic device sizes become smaller, challenges exist with current metal films used for contacts, barrier layers, etc. New metals and metal films are needed for a variety of applications in microelectronic devices. Tellurium has not been previously used in microelectronic applications. Accordingly, there is a need in the art for new methods of depositing tellurium-containing films for microelectronic devices.

SUMMARY

One or more embodiments of the disclosure are directed to methods of depositing a film. A substrate is exposed to a tellurium precursor in a processing chamber to deposit a film on the substrate. The processing chamber is purged of the tellurium precursor and the substrate is exposed to a reactant to react with the film to form a tellurium film on the substrate. The processing chamber is then purged of the reactant.

Additional embodiments of the disclosure are directed to methods of depositing a film. A substrate is exposed to a tellurium precursor in a processing chamber to deposit a tellurium film on the substrate. The processing chamber is purged of the tellurium precursor and the substrate is exposed to one or more of a germanium precursor and an antimony precursor to react with the tellurium film to form one or more of a germanium tellurium film, germanium tellurium antimony film, or antimony tellurium film on the substrate. The processing chamber is then purged of the germanium precursor and the antimony precursor Further embodiments of the disclosure are directed to methods of depositing a film. A tellurium-containing film is selectively formed by a process cycle comprising sequential exposure of a substrate to a tellurium precursor, purge gas, a reactant, and purge gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 illustrates a flowchart of a processing method in accordance with one or more embodiment of the disclosure.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

In one or more embodiments, the tellurium-containing precursors are provided that advantageously have high thermal stability, allowing one to facilitate a broader range of process temperatures for ALD. Current tellurium precursors have very low thermal stability, therefore ALD processing for these materials cannot be achieved at temperatures greater than 100° C.

Tellurium (Te) can be grown by atomic layer deposition for many applications. One or more embodiments of the disclosure advantageously provide processes for atomic layer deposition to form tellurium-containing films. As used in this specification and the appended claims, the term "tellurium-containing film" refers to a film that comprises tellurium atoms and has greater than or equal to about 1 atomic % tellurium, greater than or equal to about 2 atomic % tellurium, greater than or equal to about 3 atomic % tellurium, greater than or equal to about 4 atomic % tellurium, greater than or equal to about 5 atomic % tellurium, greater than or equal to about 10 atomic % tellurium, greater than or equal to about 15 atomic % tellurium, greater than or equal to about 20 atomic % tellurium, greater than or equal to about 25 atomic % tellurium, greater than or equal to about 30 atomic % tellurium, greater than or equal to about 35 atomic % tellurium, greater than or equal to about 40 atomic % tellurium, greater than or equal to about 45 atomic % tellurium, greater than or equal to about 50 atomic % tellurium, or greater than or equal to about 60 atomic % tellurium. In some embodiments, the tellurium-containing film comprises one or more of tellurium (elemental tellurium), tellurium oxide ($TeO_3$), tellurium carbide (TeC), or tellurium silicide ($TeSi_2$, $Te_2Si_3$). The skilled artisan will recognize that the use of molecular formula like $TeSi_x$ does not imply a specific stoichiometric relationship between the elements but merely the identity of the major components of the film. For example, $TeSi_x$ refers to a film whose major composition comprises tellurium and silicon atoms. In some embodiments, the major composition of the specified film (i.e., the sum of the atomic percents of the specified atoms) is greater than or equal to about 95%, 98%, 99% or 99.5% of the film, on an atomic basis.

With reference to FIG. 1, one or more embodiments of the disclosure are directed to method 100 of depositing a thin film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)). In one or more embodiments, an adhesion layer, such as titanium nitride, is deposited at operation 105.

At deposition 110, a process is performed to deposit a tellurium-containing thin film on the substrate (or substrate surface). The deposition process can include one or more operations to form a film on the substrate. In operation 112, the substrate (or substrate surface) is exposed to a tellurium precursor to deposit a film on the substrate (or substrate surface). The tellurium precursor can be any suitable tellurium-containing compound that can react with (i.e., adsorb or chemisorb onto) the substrate surface to leave a tellurium-containing species on the substrate surface.

In one or more embodiments, the tellurium precursor has a structure of Formula (I):

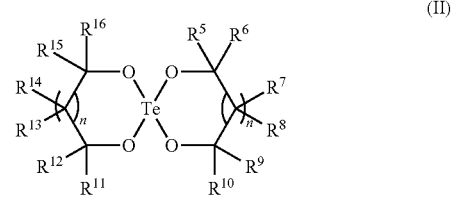

wherein $R^1$, $R^2$, $R^3$, $R^4$ are independently selected from hydrogen, hydrocarbons, fluorocarbons, heteroatom-containing hydrocarbons, silicon containing groups (e.g., $SiR_3$), germanium-containing groups (e.g., $GeR_3$). In one or more embodiments, $R^1$, $R^2$, $R^3$, $R^4$ include but are not limited to hydrogen, methyl, trifluoromethyl, ethyl, trifluoroethyl, propyl, isopropyl, butyl, isobutyl, and tert butyl.

In other embodiments, the tellurium precursor has a structure of Formula (II):

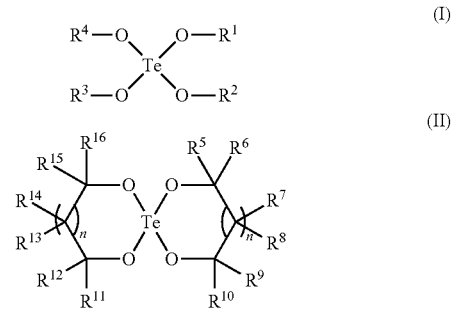

wherein $R^5$, $R^6$, $R^7$, $R^8$, $R^9$, $R^{10}$, $R^{11}$, $R^{12}$, $R^{13}$, $R^{14}$, $R^{15}$, and $R^{16}$ are independently selected from hydrogen, hydrocarbons, fluorocarbons, heteroatom-containing hydrocarbons, silicon containing groups (e.g., $SiR_3$), germanium-containing groups (e.g., $GeR_3$), and n is a number in a range from 0 to 5. As recognized by one of skill in the art, when n is 0, $R^7$ and $R^8$ are absent. In one or more embodiments, $R^5$, $R^6$, $R^7$, $R^8$, $R^9$, $R^{10}$, $R^{11}$, $R^{12}$, $R^{13}$, $R^{14}$, $R^{15}$, and $R^{16}$ include but are not limited to hydrogen, methyl, trifluoromethyl, ethyl, trifluoroethyl, propyl, isopropyl, butyl, isobutyl, and tert butyl.

In further embodiments, the tellurium precursor has a structure of Formula (I) or Formula (II):

$$R^4-O\underset{R^3-O}{\overset{}{\diagdown}}\underset{}{\overset{}{Te}}\underset{}{\overset{O-R^1}{\diagup}}\underset{}{O-R^2} \quad (I)$$

$$(II)$$

wherein $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ are independently selected from hydrogen, hydrocarbons, fluorocarbons, heteroatom-containing hydrocarbons, silicon containing groups (e.g. $SiR_3$), and germanium-containing groups (e.g. $GeR_3$), and n is a number in a range from 0 to 5. As recognized by one of skill in the art, when n is 0, $R^7$ and $R^8$ are absent. In one or more embodiments, $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ include but are not limited to hydrogen, methyl, trifluoromethyl, ethyl, trifluoroethyl, propyl, isopropyl, butyl, isobutyl, and tert butyl.

In one or more specific embodiments, the tellurium precursor comprises one or more of

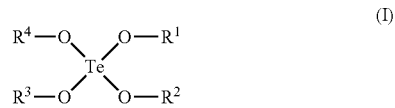

-continued

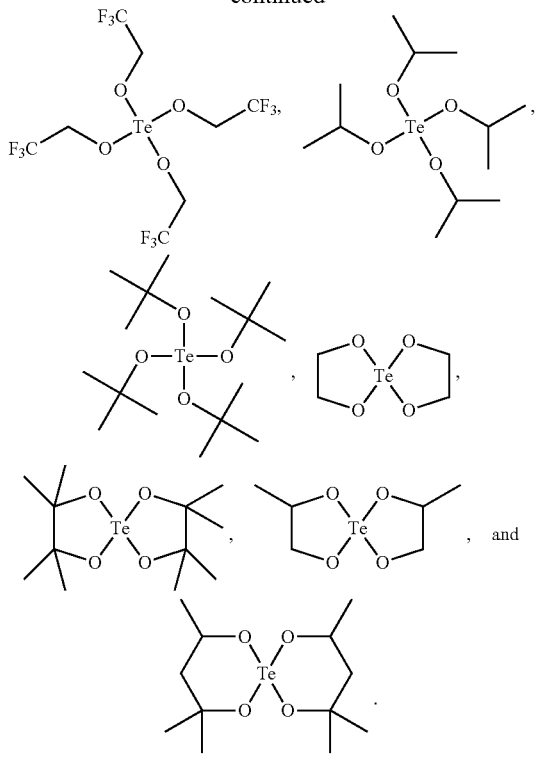

In other specific embodiments, the tellurium precursor comprises one or more of

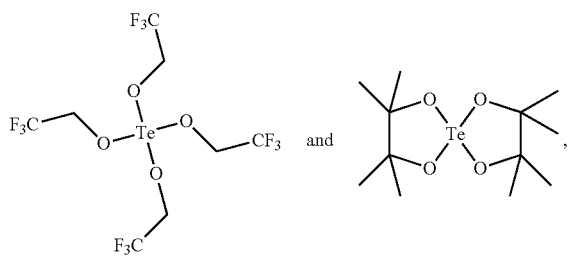

The substrate (or substrate surface) can be any suitable surface. Suitable surfaces include, but are not limited to, silicon (Si), silicon dioxide (SiO$_2$), silicon oxide (SiOx), silicon oxycarbide (SiOC), platinum (Pt), titanium nitride (TiN), tantalum nitride (TaN), copper (Cu), cobalt (Cu), tungsten (W), ruthenium (Ru), molybdenum (Mo), amorphous carbon, or combinations thereof. In one or more embodiments, the substrate comprises a thermal conductor.

At operation 114, the processing chamber is purged to remove unreacted tellurium precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the tellurium precursor by any suitable technique including, but not limited to, moving the substrate through a gas curtain to a portion or sector of the processing chamber that contains none or substantially none of the tellurium precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

At operation 116, the substrate (or substrate surface) is exposed to a reactant or a co-reactant to form one or more of a tellurium film on the substrate. The reactant or co-reactant can react with the tellurium-containing species on the substrate surface to form the tellurium-containing film. In some embodiments, the reactant or co-reactant comprises a reducing agent. In one or more embodiments, the reducing agent can comprise any reducing agent known of to one of skill in the art. In other embodiments, the reactant or co-reactant comprises an oxidizing agent. In one or more embodiments, the oxidizing agent can comprise any oxidizing agent known to one of skill in the art. In further embodiments, the reactant comprises one or more of an oxidizing agent and a reducing agent.

In specific embodiments, the reactant can be selected from one or more of 1,1-dimethylhydrazine (DMH), alkyl amine, hydrazine, substituted hydrazines, alkyl hydrazine, allyl hydrazine, hydrogen, ammonia, alcohols, water, oxygen (O$_2$), ozone (O$_3$), peroxides (e.g. hydrogen peroxide (H$_2$O$_2$)), nitrous oxide (N$_2$O), Sb(SiR$_3$)$_3$, Te(SiR$_3$)$_2$, alkanes, alkenes, alkynes, trimethylaluminum (Al(CH$_3$)$_3$)), silanes, substituted silanes, and plasmas thereof. In some embodiments, the alkyl amine is selected from one or more of tert-butyl amine (tBuNH$_2$), isopropyl amine (iPrNH$_2$), ethylamine (CH$_3$CH$_2$NH$_2$), diethylamine ((CH$_3$CH$_2$)$_2$NH), or butyl amine (BuNH$_2$). In some embodiments, the reactant comprises one or more of compounds with the formula R'NH$_2$, R'$_2$NH, R'$_3$N, R'$_2$SiNH$_2$, (R'$_3$Si)$_2$NH, (R'$_3$Si)$_3$N or main group alkyls such as GeR'$_3$ and analogues; where each R' is independently H or an alkyl group having 1-12 carbon atoms. In some embodiments, the alkyl amine consists essentially of one or more of tert-butyl amine (tBuNH$_2$), isopropyl amine (iPrNH$_2$), ethylamine (CH$_3$CH$_2$NH$_2$), diethylamine ((CH$_3$CH$_2$)$_2$NH), butyl amine (BuNH$_2$).

In other embodiments, the reactant comprises one or more of a germanium (Ge) precursor or an antimony (Sb) precursor. As recognized by one of skill in the art, when the tellurium-containing species is reacted with one or more of a germanium (Ge) precursor or an antimony (Sb) precursor, one or more of a germanium telluride (GeTe) film, germanium antimony telluride (GeSbTe) film, or antimony telluride (SbTe) film is formed on the substrate.

Ge$_2$Sb$_2$Te$_5$ (Germanium antimony telluride, GST) is an emerging area of research due to its applications in phase change memory devices, e.g. PCRAM. In one or more embodiments, tellurium precursors are used to deposit GST films using different combinations of antimony and germanium complexes as ALD precursors. In one or more embodiments, the deposited thin films are further analyzed for phase change random memory access (PCRAM) applications. Phase-change memory (e.g. PCRAM) is a type of non-volatile random-access memory. In one or more embodiments, the tellurium precursors are used to deposit films having plasticity and flexibility for use in PCRAM applications.

At operation 118, the processing chamber is purged after exposure to the reactant. Purging the processing chamber in operation 118 can be the same process or different process than the purge in operation 114. Purging the processing chamber, portion of the processing chamber, area adjacent the substrate surface, etc., removes unreacted reactant, reaction products and by-products from the area adjacent the substrate surface.

At decision 120, the thickness of the deposited film, or number of cycles of tellurium-precursor and reactant is considered. If the deposited film has reached a predetermined thickness or a predetermined number of process cycles have been performed, the method 100 moves to an optional post-processing operation 130. If the thickness of the deposited film or the number of process cycles has not reached the predetermined threshold, the method 100 returns to operation 110 to expose the substrate surface to the tellurium precursor again in operation 112, and continuing.

The optional post-processing operation 130 can be, for example, a process to modify film properties (e.g., annealing) or a further film deposition process (e.g., additional ALD or CVD processes) to grow additional films. In some embodiments, the optional post-processing operation 130 can be a process that modifies a property of the deposited film. In some embodiments, the optional post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film.

The method 100 can be performed at any suitable temperature depending on, for example, the tellurium precursor, reactant or thermal budget of the device. In some embodiments, exposures to the tellurium precursor (operation 112) and the reactant (operation 116) occur at the same temperature. In some embodiments, the substrate is maintained at a temperature in a range of about 20° C. to about 400° C., or about 50° C. to about 250° C.

In some embodiments, exposure to the tellurium precursor (operation 112) occurs at a different temperature than the exposure to the reactant (operation 116). In some embodiments, the substrate is maintained at a first temperature in a range of about 20° C. to about 400° C., or about 50° C. to about 250° C., for the exposure to the tellurium precursor, and at a second temperature in the range of about 20° C. to about 400° C., or about 50° C. to about 250° C., for exposure the reactant.

In the embodiment illustrated in FIG. 1, deposition operation 110 the substrate (or substrate surface) is exposed to the tellurium precursor and the reactant sequentially. In another, un-illustrated, embodiment, the substrate (or substrate surface) is exposed to the tellurium precursor and the reactant simultaneously in a CVD reaction. In a CVD reaction, the substrate (or substrate surface) can be exposed to a gaseous mixture of the tellurium precursor and reactant to deposit a tellurium-containing film having a predetermined thickness. In the CVD reaction, the tellurium-containing film can be deposited in one exposure to the mixed reactive gas, or can be multiple exposures to the mixed reactive gas with purges between.

In some embodiments, the tellurium-containing film formed comprises elemental tellurium. Stated differently, in some embodiments, the tellurium-containing film comprises a metal film comprising tellurium. In some embodiments, the metal film consists essentially of tellurium. As used in this manner, the term "consists essentially of tellurium" means that the tellurium-containing film is greater than or equal to about 80%, 85%, 90%, 95%, 98%, 99% or 99.5% tellurium, on an atomic basis. Measurements of the composition of the tellurium-containing film refer to the bulk portion of the film, excluding interface regions where diffusion of elements from adjacent films may occur.

In other embodiments, the tellurium-containing film comprises tellurium oxide ($TeO_x$) with an oxygen content of greater than or equal to about 5%, 7.5%, 10%, 12.5 or 15%, on an atomic basis. In some embodiments, the tellurium-containing film comprises an oxygen content in the range of about 2% to about 30%, or in the range of about 3% to about 25%, or in the range of about 4% to about 20%, on an atomic basis.

In other embodiments, the tellurium-containing film comprises tellurium carbide ($TeC_x$) with a carbon content of greater than or equal to about 5%, 7.5%, 10%, 12.5 or 15%, on an atomic basis. In some embodiments, the tellurium-containing film comprises a carbon content in the range of about 2% to about 30%, or in the range of about 3% to about 25%, or in the range of about 4% to about 20%, on an atomic basis.

In other embodiments, the tellurium-containing film comprises tellurium silicide ($TeSi_x$) with a silicon content of greater than or equal to about 5%, 7.5%, 10%, 12.5 or 15%, on an atomic basis. In some embodiments, the tellurium-containing film comprises a silicon content in the range of about 2% to about 30%, or in the range of about 3% to about 25%, or in the range of about 4% to about 20%, on an atomic basis.

The deposition operation 110 can be repeated to form one or more of a tellurium (e.g. elemental tellurium) film, a tellurium oxide film, a tellurium carbide film, a tellurium silicide film, a germanium tellurium film, a germanium tellurium antimony film, and an antimony tellurium film having a predetermined thickness. In some embodiments, the deposition operation 110 is repeated to provide one or more of a tellurium (e.g. elemental tellurium) film, a tellurium oxide film, a tellurium carbide film, a tellurium silicide film, a germanium tellurium film, a germanium tellurium antimony film, and an antimony tellurium film having a thickness in the range of about 0.3 nm to about 100 nm, or in the range of about 30 Å to about 3000 Å.

In some embodiments, the deposition operation 110 results in the formation of a tellurium nitride ($TeN_x$) film. Without intending to be bound by theory, it is believed that tellurium nitride is unstable, so an elemental tellurium film results. In some embodiments, the deposition operation 110 results in the formation of one or more of tellurium nitride ($TeN_x$), antimony nitride ($SbN_x$), and germanium nitride ($GeN_x$) as a transient species by reaction of a reactant (e.g., hydrazine, dimethyl hydrazine, and the like) and one or more of a tellurium precursor, an antimony precursor, and a germanium precursor.

One or more embodiments of the disclosure are directed to methods of depositing tellurium-containing films in high aspect ratio features. A high aspect ratio feature is a trench, via or pillar having a height:width ratio greater than or equal to about 10, 20, or 50, or more. In some embodiments, the tellurium-containing film is deposited conformally on the high aspect ratio feature. As used in this manner, a conformal film has a thickness near the top of the feature that is in the range of about 80-120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom (e.g., a nitride) and a second material (e.g., an oxide) at the sidewalls. The tellurium-containing film deposits selectively on the first material relative to the second material so that the tellurium film fills the feature in a bottom-up manner.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1. Tetramethoxy tellurane

To a stirred solution of $TeCl_4$ (0.5 g, 1.855 mmol) and methanol (0.3 mL, 7.516 mmol) in tetrahydrofuran (10 mL), triethylamine (1.1 mL, 7.52 mmol) solution in tetrahydrofuran (10 mL) was added dropwise at −40° C. This resulted in the formation of a white precipitate of triethylamine hydrochloride. The reaction was allowed to stir for 2 hours, maintaining the same temperature. The reaction mixture was filtered through a coarse glass frit after 2 hours. The volatile components were removed under reduced pressure and the product was isolated as brown-colored viscous liquid. NMR ($^1H$, $CDCl_3$): 3.98 ppm (s, —$CH_3$); ($^{13}C$): 53.55 ppm (s, —$CH_3$).

Example 2: Tetrakis(Isopropyloxy) Tellurane

A solution of $TeCl_4$ (2 g, 7.424 mmol) in tetrahydrofuran/toluene mixture (30 mL, 1:1) was slowly added to freshly synthesized sodium isopropoxide in isopropanol at ambient temperature (sodium isopropoxide was synthesized by refluxing Na (0.683 g, 2.969 mmol) in isopropanol (30 mL)). The reaction mixture was then stirred for 2 hours. The volatile components were removed under reduced pressure. The product distilled at 85° C. at 0.2 Torr as a colorless liquid. NMR ($^1$H, CDCl$_3$): 1.21 ppm (d, —CH$_3$), 4.57 ppm (septet, —CH); ($^{13}$C): 25.35 ppm (s, —CH$_3$), 65.16 (s, —CH). bp 145° C.

Example 3: Tetrakis(Tert-Butyloxy) Tellurane

Tetrakis(tert-butyloxy) tellurane was synthesized using the same synthetic procedure as Example 2. The product sublimes at 85° C. at 0.2 Torr as colorless crystals. NMR ($^1$H, CDCl$^3$): 1.43 ppm (s, —CH$_3$). mp 38-40° C., decomposition at 140° C.

Example 4: Tetrakis(2,2,2-Trifluoroethoxy) Tellurane 2,2,2-Trifluoroethanol (8.87 mL, 0.122 mol) was added slowly to a suspension of Na (2 g, 0.087 mol) in tetrahydrofuran (30 mL). The reaction mixture was allowed to stir overnight. This solution was then added to a solution of TeCl$_4$ (5.85 g, 0.022 mol) in tetrahydrofuran (20 mL) at −40° C. The resulting solution was stirred for 2 hour at −40° C., and then the reaction flask was allowed to warm to ambient temperature.

Tetrahydrofuran was removed under reduced pressure after completion of reaction and the product was distilled at 80° C. at 0.2 Torr as a colorless liquid. NMR ($^1$H, CDCl$_3$): 4.41 ppm (q, —CH$_2$); 13C: 62.25 ppm (q, —CH$_2$), 124.20 ppm (q, —CF$_3$); 19F: 75.68 ppm (t, —CF$_3$). bp 80° C. at 0.2 Torr, distills at 257° C. followed by decomposition.

Example 5: Tellurium Ethylene Glycolate

A suspension of TeO$_2$ (1 g, 6.2 mmol) in ethylene glycol (15 mL, excess) was heated at 150° C. for 16 hours. The solution was filtered while hot and yielded the white crystalline product upon cooling. This material was separated and dried under vacuum. White crystals were obtained by sublimation at 130° C. at 0.2 Torr. mp 204-208° C., decomposition at 223° C.

Example 6: Tellurium Pinacolate

To a stirred solution of TeCl$_4$ (1 g, 3.711 mmol) and 2,3-dimethyl-2,-3 butanediol (0.877 g, 7.424 mmol) in tetrahydrofuran (15 mL), triethyl amine (2.070 mL, 14.847 mmol) was added slowly at −78° C. resulting in a white precipitate of triethylamine hydrochloride. This solution was stirred for 2 hours followed by separation of the precipitate by filtration. Tetrahydrofuran was removed under reduced pressure. Purification was carried out by sublimation at 90° C. at 0.2 Torr. NMR ($^1$H, CDCl$_3$): 1.28 ppm (s, —CH$_3$), 1.20 ppm (s, —CH$_3$,). mp 229-231° C., decomposition at 250° C.

Example 7: Tellurium Propanediolate

Tellurium propanediolate was synthesized using the same synthetic procedure as Example 6. The product sublimes at 85° C. at 0.2 Torr as white solid. mp 92° C., decomposition at 110° C.

Example 8: Tellurium Hexyleneglycolate

Tellurium hexyleneglycolate was synthesized using the same synthetic procedure as Example 6. The product sublimes at 97° C. at 0.2 Torr as white solid. mp 174° C., decomposition at 178° C.

Table 1 shows the thermal properties of the tellurium compounds.

TABLE 1

| Example No. | Complex | $T_{50}$ | mp/bp | $T_{Dec}$ |
| --- | --- | --- | --- | --- |
| 1 | Te(OMe)$_4$ (liq) | 199° C. | 115 (9 mm) | — |
| Commercially available | Te(OEt)$_4$ (liq) | 126° C. | 100° C. (0.25 mm) | <100° C. |
| 2 | Te(O$^i$Pr)$_4$ (liq) | 124° C. | 145° C. | 115° C. |
| 3 | Te(O$^t$Bu)$_4$ (solid) | 126° C. | 38-40° C. | 140° C. |
| 4 | Te(OCH$_2$CF$_3$)$_4$ (liq) | 120° C. | — | 257° C. |
| 5 | Te(OCH$_2$CH$_2$O)$_2$ (solid) | 199° C. | 204-208° C. | 223° C. |
| 6 | Te(Pin)$_2$ (solid) | 172° C. | 229-231° C. | 250° C. |
| 7 | Te(Propanediolate)$_2$ (solid) | 165° C. | 92° C. | 110° C. |
| 8 | Te(Hexyleneglycolate)$_2$ (solid) | 172° C. | 174° C. | 178° C. |

Example 9: Atomic Layer Deposition of Tellurium Containing Films

General procedure: A silicon substrate was placed in a processing chamber. A tellurium precursor was flowed into the processing chamber in an atmosphere of nitrogen (N$_2$) gas over the silicon substrate leaving a tellurium-precursor terminated surface. Unreacted precursor and byproducts are then purged out of the chamber. Next, a co-reactant was then introduced into the chamber that reacts with the surface-bound tellurium species. Again, excess coreactant and byproducts were removed from the chamber. The resultant material on the substrate was a tellurium-containing film. In the event a GST material is desired to be produced by ALD, a supercycle composed of a germanium precursor and desired coreactant, a tellurium precursor and desired coreactant, and finally an antimony precursor and desired coreactant in any particular combination to tune the desired film composition. [Ge-precursor/Purge/Coreactant/Purge/Sb-Precursor/Purge/Coreactant/Purge/Te-Precursor/Purge] or similar; combination or order can be different.

Example 10: Atomic Layer Deposition of Tellurium

The metal precursor tetrakis trifluoroethoxy tellurium (Te(OCH$_2$CF$_3$)$_4$) (Example 4) was synthesized and isolated in pure form by vacuum distillation at 80° C./0.2 Torr.

NMR spectra were recorded using a Varian 400 MHz instrument. Thermogravimetric analysis was carried out on a TA Q50 TGA instrument. Melting points were determined on a Thermo Scientific Mel-Temp 3.0 digital melting point apparatus.

ALD experiments were performed in a Picosun ALD reactor. Elemental Te was deposited on an amorphous C (~5 nm)/Si substrate, W (~10 nm)/Si substrate over the deposition temperature range of 75° C.-200° C. Te(OCH$_2$CF$_3$)$_4$ was delivered from a booster at 50° C. to the reactor chamber. For the delivery of the co-reactant (NH$_2$NH$_2$), a conventional vapor-draw bubbler was used. To limit the consumption of hydrazine, a flow restricting VCR gasket (100 μm) was installed in the bubbler line.

The deposition process was followed by Hitachi FT150h X-ray Fluorescence spectrometer (XPF). Room temperature sheet resistivities were measured using a Jandel 4-point probe RM3000+. Film thicknesses were measured with cross-sectional scanning electron microscopy (SEM) on a JEOL-6510LV scanning electron microscope. A top-down view was also recorded to study the morphology of the deposited films. Grazing incidence X-ray diffraction (GI-XRD) was measured on a Bruker D-8 Advance diffractometer with Cu Kα radiation. The composition of the films was determined by X-ray photoelectron spectroscopy (XPS) on a Thermofisher Nexsa instrument using an Al Kα X-ray source.

The films deposited on W show different morphology at different temperatures. The low temperature (75° C. and 100° C.) data revealed the formation of a continuous film with the same growth rate of 0.1 Å/cycle. However, films deposited at temperature 125° C. and higher were not continuous, rather they showed island type growth.

The film thickness was evaluated by SEM. The substrate surface was found to be saturated with 0.1 s of pulse length of hydrazine for W and C substrate. The growth rate (0.1 Å/cycle) remained constant from 0.1 s to 0.5 s in the case of both substrates.

The quantification data of the films obtained by XRF was in close agreement with SEM cross-section analysis.

The resistivity of the film deposited on W was found to increase on increasing the hydrazine pulse time. However, no clear trend of film resistivities was observed for films deposited with different hydrazine pulse time on C substrate.

The saturation behavior of Te(OCH$_2$CF$_3$)$_4$ was studied in a similar manner keeping the hydrazine pulse constant at 0.1 s for both the substrate. The growth rate remained constant from 3 s to 5 s pulse time of Te(OCH$_2$CF$_3$)$_4$.

To study the composition, 15-20 nm thick tellurium films were grown on W and C by running 2000 cycles at 100° C. To reach the bulk, sequential erosion of films was done by sputtering Ar$^+$ ion.

The bulk of the films could reach in a short period of etching time since films were not too thick. The composition of films is given in Table 2.

TABLE 2

Bulk composition of films deposited on W and C after 14 s of etching time as evaluated by XPS

| Substrate | Te3d5/2 (at. %) | W4f7/2 (at. %) | F1s (at. %) | O1s (at. %) | N1s (at. %) | C1s (at. %) |
|---|---|---|---|---|---|---|
| W | 66.59 | 25.83 | 0 | 3.26 | 1.16 | 3.15 |
| C | 85.16 | — | 0 | 1.41 | 1.64 | 12.80 |

Film grown on W showed approximately 66% of tellurium content. Another major content was tungsten, which contributed approximately 26% of the total composition of the film. Oxygen and carbon were 3.26% and 3.15% respectively with 1.16% of nitrogen. The film was fluorine-free. The high tungsten content was most likely due to the ionization of substrate in the Te film.

The film deposited on C showed a Te content of approximately 85% with 12.8% carbon and 0% fluorine. Oxygen and nitrogen were 1.41% and 1.64% respectively. The significant amount of carbon may be due to the formation of carbide species and/or diffusion of carbon from the C substrate. However, the presence of only 3.15% carbon in a film deposited on W ruled out the possibility of the formation of any carbide species during the deposition process. The nitrogen was 1.64% which was found to increase after 50 s of etching time. The increase in nitrogen content was most likely due to the presence of nitrogen impurity in the carbon layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising: exposing a substrate to a tellurium precursor in a processing chamber to deposit a film on the substrate, the tellurium precursor having a structure of

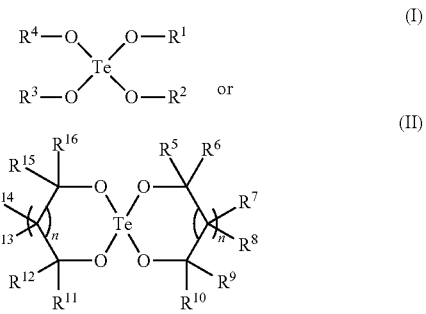

wherein $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, and $R^{16}$ are independently selected from fluorocarbons, heteroatom-containing hydrocarbons, silicon containing groups (e.g. SiR$_3$), and germanium-containing groups (e.g. GeR$_3$), and n is a number in a range from 0 to 5;

purging the processing chamber of the tellurium precursor,
  exposing the substrate to a reactant to react with the film to form an elemental tellurium film on the substrate; and
  purging the processing chamber of the reactant.

2. The method of claim 1, wherein the reactant comprises a reducing agent.

3. The method of claim 1, wherein the substrate comprises one or more of silicon (Si), silicon dioxide (SiO$_2$), silicon oxide (SiO), silicon oxycarbide (SiOC), platinum (Pt), titanium nitride (TiN), tantalum nitride (TaN), copper (Cu), cobalt (Co), tungsten (W), ruthenium (Ru) or molybdenum (Mo).

4. The method of claim 1, wherein the substrate is maintained at a temperature in a range of about 20° C. to about 400° C.

5. The method of claim 1, further comprising repeating the method to provide a tellurium film having a thickness of about 0.3 to about 100 nm.

6. The method of claim 1, wherein the tellurium precursor comprises

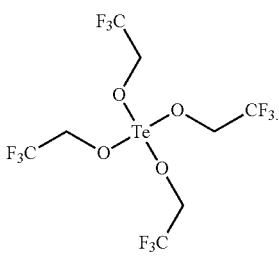

7. The method of claim 1, wherein the tellurium precursor is Te(OCH$_2$CF$_3$)$_4$.

8. A method of depositing a film, the method comprising:
  exposing a substrate to a tellurium precursor in a processing chamber to deposit an elemental tellurium film on the substrate, the tellurium precursor having a structure of

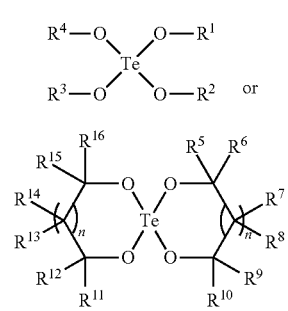

wherein R$^1$, R$^2$, R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, and R$^{16}$ are independently selected from fluorocarbons, heteroatom-containing hydrocarbons, silicon containing groups (e.g. SiR$_3$), and germanium-containing groups (e.g. GeR$_3$), and n is a number in a range from 0 to 5;

purging the processing chamber of the tellurium precursor,
  exposing the substrate to one or more of a germanium precursor and an antimony precursor to react with the elemental tellurium film to form one or more of a germanium tellurium film, germanium tellurium antimony film, or antimony tellurium film on the substrate; and
  purging the processing chamber of the germanium precursor and the antimony precursor.

9. The method of claim 8, wherein the substrate comprises one or more of silicon (Si), silicon dioxide (SiO$_2$), silicon oxide (SiO), silicon oxycarbide (SiOC), platinum (Pt), titanium nitride (TiN), tantalum nitride (TaN), copper (Cu), cobalt (Co), tungsten (W), ruthenium (Ru) or molybdenum (Mo).

10. The method of claim 8, wherein the substrate is maintained at a temperature in a range of about 20° C. to about 400° C.

11. The method of claim 8, wherein the tellurium precursor is Te(OCH$_2$CF$_3$)$_4$.

12. A method of depositing a film, the method comprising:
  selectively forming an elemental tellurium film in a process cycle comprising sequential exposure of a substrate to a tellurium precursor, purge gas, reactant, and purge gas, the tellurium precursor having a structure of

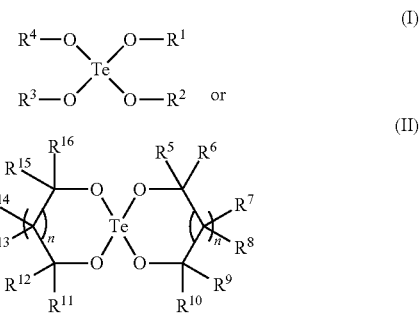

wherein R$^1$, R$^2$, R$^3$, R$^4$, R$^5$, R$^6$, R$^7$, R$^8$, R$^9$, R$^{10}$, R$^{11}$, R$^{12}$, R$^{13}$, R$^{14}$, R$^{15}$, and R$^{16}$ are independently selected from fluorocarbons, heteroatom-containing hydrocarbons, silicon containing groups (e.g. SiR$_3$), and germanium-containing groups (e.g. GeR$_3$), and n is a number in a range from 0 to 5.

13. The method of claim 12, wherein the reactant comprises one or more a reducing agent, a germanium precursor, and an antimony precursor.

14. The method of claim 12, wherein the process cycle is maintained at a temperature in a range of about 20° C. to about 400° C.

15. The method of claim 12, wherein the tellurium precursor is Te(OCH$_2$CF$_3$)$_4$.

* * * * *